(12) United States Patent
Chang et al.

(10) Patent No.: US 10,866,286 B2
(45) Date of Patent: Dec. 15, 2020

(54) CONNECTION DETECTION SYSTEM AND DETECTION METHOD THEREOF

(71) Applicant: PEGATRON CORPORATION, Taipei (TW)

(72) Inventors: Yi-Tso Chang, Taipei (TW); Po-Liang Yeh, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 77 days.

(21) Appl. No.: 16/217,954

(22) Filed: Dec. 12, 2018

(65) Prior Publication Data

US 2019/0277901 A1 Sep. 12, 2019

(30) Foreign Application Priority Data

Mar. 7, 2018 (TW) .............................. 107107776 A

(51) Int. Cl.
*G01R 31/04* (2006.01)
*G06F 13/00* (2006.01)
*G01R 31/68* (2020.01)

(52) U.S. Cl.
CPC .................................... *G01R 31/68* (2020.01)

(58) Field of Classification Search
CPC ........ G06F 13/00; G06F 1/26; G06F 13/4081; G01R 31/04; G01R 31/043
See application file for complete search history.

(56) References Cited

U.S. PATENT DOCUMENTS

| 2008/0282009 A1* | 11/2008 | Fu ........................ G06F 13/4072 710/301 |
| 2010/0088449 A1* | 4/2010 | Wang .................. G06F 13/4081 710/301 |
| 2012/0188216 A1 | 7/2012 | Gu et al. |
| 2013/0060984 A1* | 3/2013 | Brandyberry ............. G06F 1/20 710/305 |

* cited by examiner

*Primary Examiner* — Neel D Shah
(74) *Attorney, Agent, or Firm* — J.C. Patents

(57) ABSTRACT

A connection detection system and a connection detection method are provided. The connection detection system includes a connector, an expansion dock and a signal transmitter. The connector has a first detecting pin and a second detecting pin. The second detecting pin receives a first signal or a second signal from the first detecting pin when the expansion dock is connected to the connector. The signal transmitter is coupled to the connector. The signal transmitter is configured to receive a detection signal through the second detecting pin and determine whether the connector is connected to the expansion dock according to the sensing signal. The signal transmitter provides the first signal to the first detecting pin when the connector is not connected to the expansion dock. The signal transmitter provides the second signal to the second detecting pin when the connector is connected to the expansion dock.

9 Claims, 4 Drawing Sheets

CONNECTION DETECTION SYSTEM AND DETECTION METHOD THEREOF

CROSS-REFERENCE TO RELATED APPLICATION

This application claims the priority benefit of Taiwan application serial no. 107107776, filed on Mar. 7, 2018. The entirety of the above-mentioned patent application is hereby incorporated by reference herein and made a part of this specification.

BACKGROUND

Technology Field

The present disclosure relates to a connection detection system and a detection method thereof.

Description of Related Art

Today's electronic system generally has a mechanism for detecting whether a connector of the electronic system is connected to an external system. The above detection mechanism generally provides a direct current (DC) voltage on pins of the connector, such that the pins exposed in the air may have a non-zero voltage level. In this way, the pins of the connector tend to adsorb foreign matters from the air due to static electricity caused by the non-zero voltage level, which causes contamination of the pins of the connector to result in a poor contact between the electronic system and an external system.

SUMMARY

The present disclosure is directed to a connection detection system and a detection method thereof, which are adapted to reduce contamination of pins of a connector.

The present disclosure provides a connection detection system including a connector, an expansion dock and a signal transmitter. The connector is detachably connected to the expansion dock. The connector has a first detecting pin and a second detecting pin. When the expansion dock is connected to the connector, the second detecting pin receives a first signal or a second signal from the first detecting pin. The signal transmitter is coupled to the connector. The signal transmitter is configured to receive a detecting signal through the second detecting pin and determine whether the connector is connected to the expansion dock according to the detecting signal. When the connector is not connected to the expansion dock, the signal transmitter provides the first signal to the first detecting pin. When the connector is connected to the expansion dock, the signal transmitter provides the second signal to the first detecting pin.

In an embodiment of the present disclosure, the expansion dock has a first pin and a second pin, the first pin and the second pin are coupled to each other. When the connector is connected to the expansion dock through a contact of the first detecting pin and the first pin and a contact of the second detecting pin and the second pin, the signal transmitter provides the second signal to the first detecting pin.

In an embodiment of the present disclosure, the first signal is a pulse width modulation signal, and a duty cycle of the first signal is lower than 10%.

In an embodiment of the present disclosure, the second signal is a DC voltage signal of a high voltage level.

In an embodiment of the present disclosure, when the signal transmitter detects a high detecting voltage level of the detecting signal through the second detecting pin, the signal transmitter provides the second signal to the first detecting pin.

In an embodiment of the present disclosure, when the signal transmitter does not detect the high detecting voltage level through the second detecting pin, the signal transmitter provides the first signal to the first detecting pin.

In an embodiment of the present disclosure, the connection detection system further includes a resistor. A first end of the resistor is coupled to the second detecting pin and the signal transmitter, and a second end of the resistor is coupled to a reference ground potential.

In an embodiment of the present disclosure, a corresponding surface of the connector has a first short side and a second short side that is not adjacent to the first short side, the first detecting pin is a pin closest to the first short side. The second detecting pin is a pin closest to the second short side.

The present disclosure provides a connection detection method configured to detect connection between a connector and an expansion dock, wherein the connector has a first detecting pin and a second detecting pin. The connection detection method includes: receiving a detecting signal through the second detecting pin; determining whether the connector is connected to the expansion dock according to the detecting signal; applying a first signal to the first detecting pin when the connector is not connected to the expansion dock; and applying a second signal to the first detecting pin when the connector is connected to the expansion dock.

In an embodiment of the present disclosure, the expansion dock has a first pin and a second pin, the first pin and the second pin are coupled to each other. When the connector is connected to the expansion dock, the first detecting pin is connected to the first pin and the second detecting pin is connected to the second pin.

Based on the above description, the present disclosure determines whether the connector is connected to the expansion dock according to the detecting signal received through the second detecting pin. The first signal is provided to the first detecting pin when the connector is not connected to the expansion dock, and the second signal is provided to the first detecting pin when the connector is connected to the expansion dock. In this way, contamination of the pins exposed in the air is mitigated, so as to maintain good contact between the electronic system and an external system.

In order to make the aforementioned and other features and advantages of the present disclosure comprehensible, several exemplary embodiments accompanied with figures are described in detail below.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure.

DESCRIPTION OF EMBODIMENTS

Figure 1:
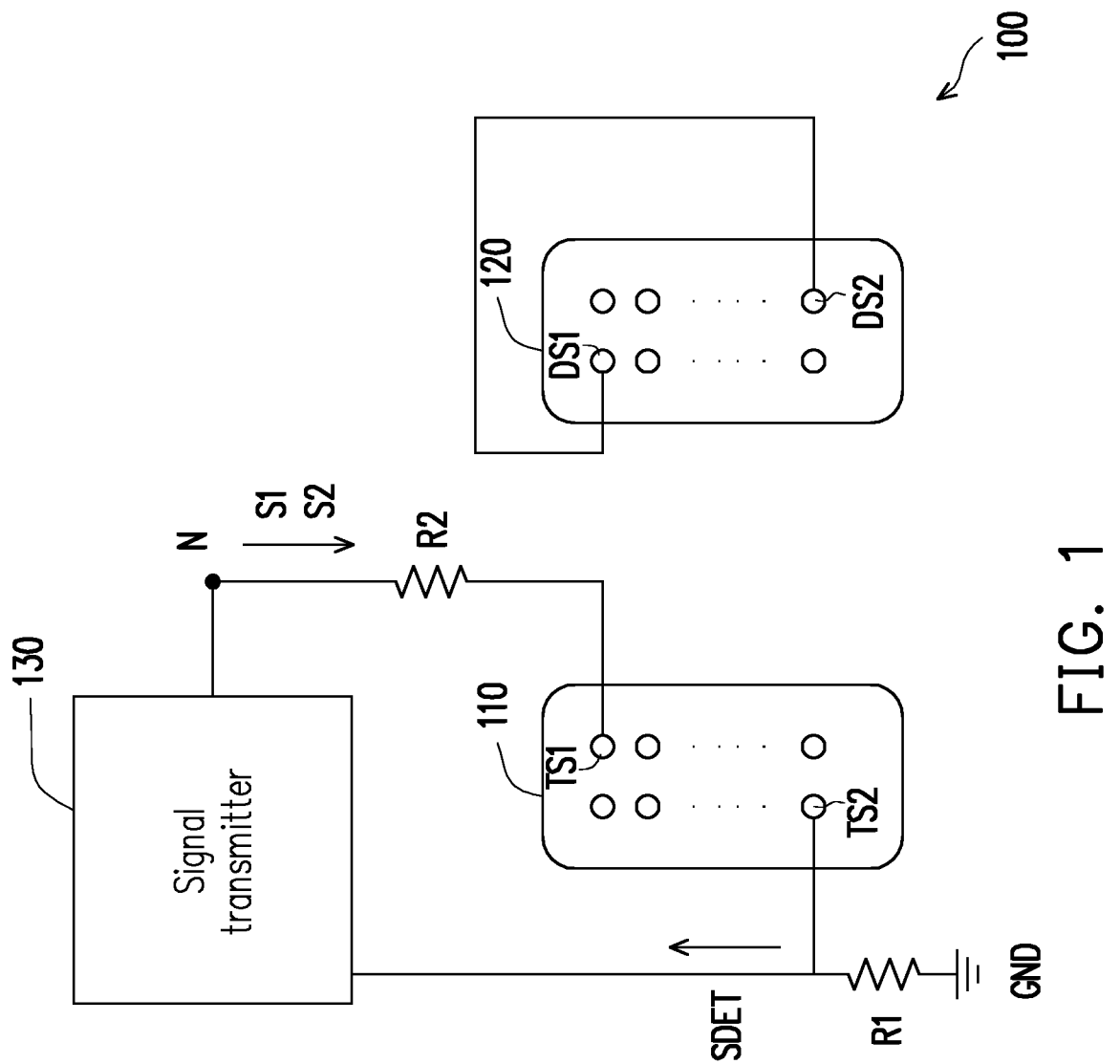
FIG. 1 is a schematic diagram of a connection detection system according to an embodiment of the present disclosure.

Referring to FIG. 1, FIG. 1 is a schematic diagram of a connection detection system according to an embodiment of the present disclosure. In the embodiment of FIG. 1, the connection detection system 100 includes a connector 110, an expansion dock 120 and a signal transmitter 130. The connector 110 has a plurality of pins. In the embodiment, the pins of the connector 110 may be various types of metal pins such as pogo pins, etc., or connection terminals corresponding to the various types of metal pins. One of the plurality of pins of the connector 110 may be selected as a first detecting pin TS1, and another one of the pins of the connector 110 may be selected as a second detecting pin TS2. When the expansion dock 120 is connected to the connector 110, the second detecting pin TS2 may receive a signal transmitted by the first detecting pin TS1. The signal transmitter 130 may be coupled to the connector 110 through the first detecting pin TS1 and the second detecting pin TS2. The signal transmitter 130 may receive a detecting signal SDET through the second detecting pin TS2, and determine whether the connector 110 is connected to the expansion dock 120 according to the detecting signal SDET. The signal transmitter 130 provides a first signal S1 to the first detecting pin TS1 when the connector 110 is not connected to the expansion dock 120. Moreover, the signal transmitter 130 provides a second signal S2 to the first detecting pin TS1 when the connector 110 is connected to the expansion dock 120. In the embodiment, the number of pins of the connector 110 and the number of pins of the expansion dock 120 may be the same, though the present disclosure is not limited thereto.

In the connection detection system 100 of the embodiment, the connector 110 and the signal transmitter 130 may be disposed in a same or different electronic devices (not shown), though the present disclosure is not limited thereto.

In the embodiment, the connection detection system 100 includes resistors R1, R2. A first end of the resistor R1 is coupled to the second detecting pin TS2 and the signal transmitter 130, and a second end of the resistor R1 is coupled to a reference ground potential GND. The resistor R2 may be coupled between the signal transmitter 130 and the first detecting pin TS1. In some embodiments, the resistor R2 may be coupled between a first pin DS1 and a second pin DS2. In some embodiments, the resistor R2 may be a parasitic resistance between the signal transmitter 130 and the first detecting pin TS1.

A connection manner of the connector 110 and the expansion dock 120 of the embodiment is further described below. The expansion dock 120 has a plurality of pins. The pins of the expansion dock 120 are metal probes or connection terminals adapted to connect to the pins of the connector 110. One of the pins of the expansion dock 120 may be selected as the first pin DS1, and another one of the pins of the expansion dock 120 may be selected as the second pin DS2. The first pin DS1 and the second pin DS2 of the expansion dock 120 are coupled to each other. When the connector 110 and the expansion dock 120 are connected, the first detecting pin TS1 of the connector 110 is connected to the first pin DS1 of the expansion dock 120, and the second detecting pin TS2 is connected to the second pin DS2 of the expansion dock 120. Since the first pin DS1 and the second pin DS2 of the expansion dock 120 are coupled to each other, the connector 110 may transmit a signal received by the first detecting pin TS1 to the second detecting pin TS2. On the contrary, in case that the connector 110 and the expansion dock 120 are not connected, the connector 110 may not transmit the signal received by the first detecting pin TS1 to the second detecting pin TS2 via the expansion dock 120.

Figure 2:
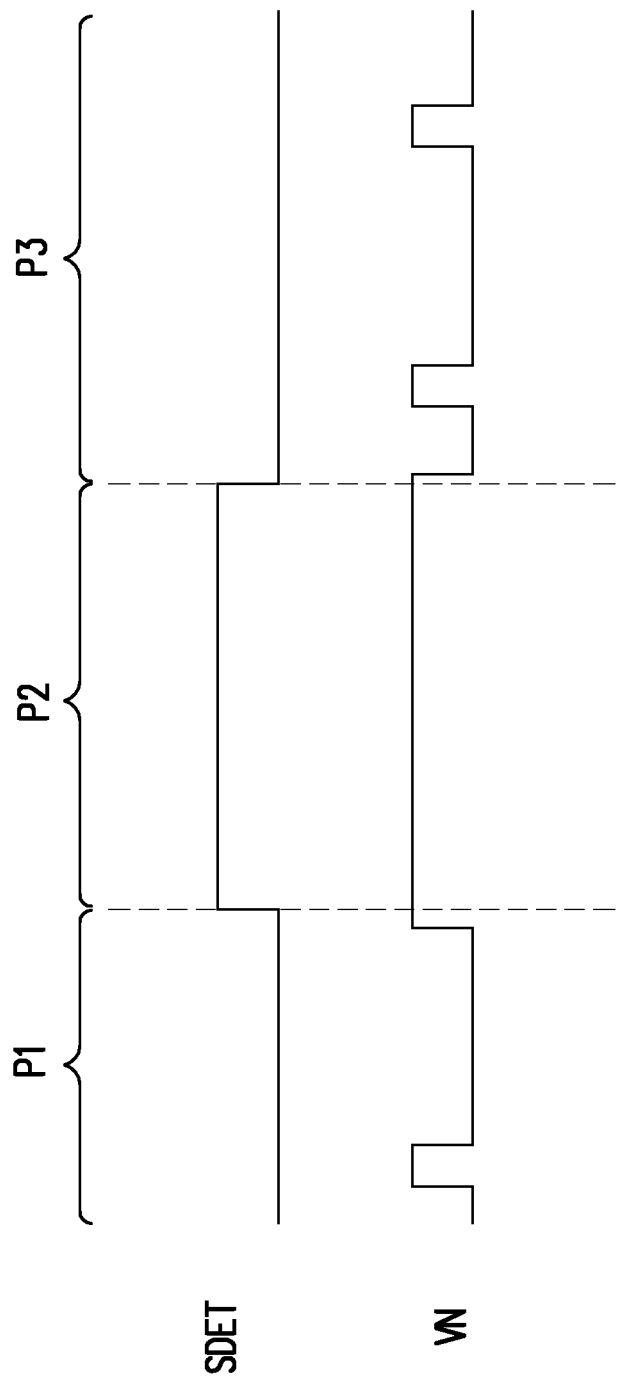
FIG. 2 is a schematic diagram of signal waveforms according to an embodiment of the present disclosure.

Referring to FIG. 1 and FIG. 2, FIG. 2 is a schematic diagram of signal waveforms according to an embodiment of the present disclosure. In a period P1, the connector 110 is not connected to the expansion dock 120, and the signal transmitter 130 continues to provide the first signal S1 to the first detecting pin TS1. In the embodiment, the first signal S1 is a Pulse Width Modulation (PWM) signal, and a duty cycle of the first signal S1 is lower than 10%. For example, in the period P1, the signal transmitter 130 provides the first signal S1, such that a voltage waveform VN at a node N is a signal output with a high voltage level and a low voltage level along with time. A pulse width of the high voltage level of the voltage waveform VN is 5 ms, and a pulse width of the low voltage level of the voltage waveform VN is 2 s. In a preferred embodiment, the pulse width of the high voltage level of the voltage waveform VN may be 1 ms, and the pulse width of the low voltage level of the voltage waveform VN is 2 s. A pulse width of the high voltage level of the first signal S1 may be determined by a signal detecting capability of the signal transmitter 130.

In the period P1, since the connector 110 is not connected to the expansion dock 120, the first detection pin TS1 of the connector 110 may not transmit the signal to the second detecting pin TS1. In this way, since the second detecting pin TS2 is grounded, and the second detecting pin TS2 cannot receive the signal transmitted by the first detecting pin TS1, the signal transmitter 130 may only receive the detecting signal SDET maintained the low voltage level. Since the signal transmitter 130 does not detect a high detecting voltage level of the detecting signal SDET through the second detecting pin TS2, the signal transmitter 130 provides the first signal S1 to the first detecting pin TS1.

It should be noted that in case that the connector 110 is not connected to the expansion dock 120, the signal transmitter 130 provides the first signal S1 with a low duty cycle to the first detecting pin TS1, so that the pin may be maintained a voltage level close to zero volt, so as to reduce contamination of the pin exposed in the air.

In the embodiment, the high detecting voltage level is a voltage dividing result on the first signal S1 or the second signal S2 according to the resistors R1, R2, so that the high detecting voltage level of the detecting signal SDET may be determined by the resistances of the resistors R1, R2. Namely, a voltage value of the high detecting voltage level may be equal to or lower than a voltage value of the high voltage level of the first signal S1 or the second signal S2. Moreover, the signal transmitter 130 may further include a comparator, which determines a connection status of the connector 110 and the expansion dock 120 according to whether the detecting signal SDET has a voltage level greater than a predetermined reference voltage level. The predetermined reference voltage level may be set according to a design requirement of the system.

In the embodiment, when the connector 110 starts to be connected to the expansion dock 120, the first detecting pin TS1 of the connector 110 may be connected to the second detecting pin TS2 of the connector 110 through the first pin DS1 and the second pin DS2 of the expansion dock 120, such that the second pin DS2 receives the first signal S1 and transmits the detecting signal SDET corresponding to the first signal S1 to the signal transmitter 130, in which the detecting signal SDET substantially has the same duty cycle with the first signal S1 at this time, i.e. the detecting signal SDET has the high detecting voltage level. The signal transmitter 130 may detect the high detecting voltage level of the detecting signal SDET through the second detecting pin TS2, so as to determine that the connector 110 is connected to the expansion dock 120. The signal transmitter 130 then provides the second signal S2 to the first detecting pin TS1 to enter a period P2. In the embodiment, the second signal S2 may be a DC voltage signal of a high voltage level, such that the voltage waveform VN of the node N is maintained the high voltage level in the period P2.

In the period P2, since the signal transmitter 130 continuously provides the second signal S2 to the first detecting pin TS1 in case that the connector 110 is connected to the expansion dock 120, the signal transmitter 130 may continuously detect the continuous high detecting voltage level of the detecting signal SDET, and determine that the connector is continuously connected to the expansion dock 120 according to the continuous high detecting voltage level.

When the connector 110 starts to be separated from the expansion dock 120, the first detecting pin TS1 of the connector 110 does not transmit signal to the second detecting pin TS2, and the signal transmitter 130 enters a period P3 in case that the high detecting voltage level of the detecting signal SDET is not detected, and provides the first signal S1 to the first detecting pin TS1.

Based on the above description, in the connection detection system 100, in case that the connector 110 is not connected to the expansion dock 120, the signal transmitter 130 provides the first signal S1 with the low duty cycle to the first detecting pin TS1, and in case that the connector 110 is connected to the expansion dock 120, the signal transmitter 130 provides the DC voltage signal to the second detecting pin TS2. In this way, in case that the connector 110 is not connected to the expansion dock 120, surfaces of the first detecting pin TS1 and the second detecting pin TS2 exposed in the air may be maintained the voltage level close to zero volt, so as to detect whether the connector 110 and the expansion dock 120 are connected, and reduce the contamination on the surfaces of the first detecting pin TS1 and the second detecting pin TS2.

In the embodiment of FIG. 1, the first detecting pin TS1 and the second detecting pin TS2 may be any two pins of the connector 110. In a preferred embodiment, the first detecting pin TS1 is not adjacent to the second detecting pint TS2. Namely, the first detecting pin TS1 and the second detecting pin TS2 are spaced by one or more pins.

Figure 3B:
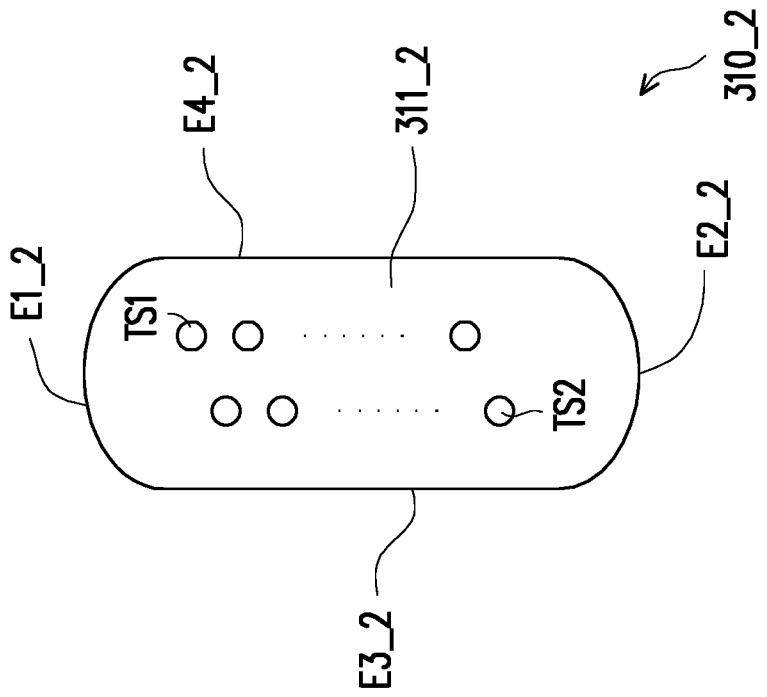
FIG. 3B is a schematic diagram of a connector according to another embodiment of the present disclosure.
Figure 3A:
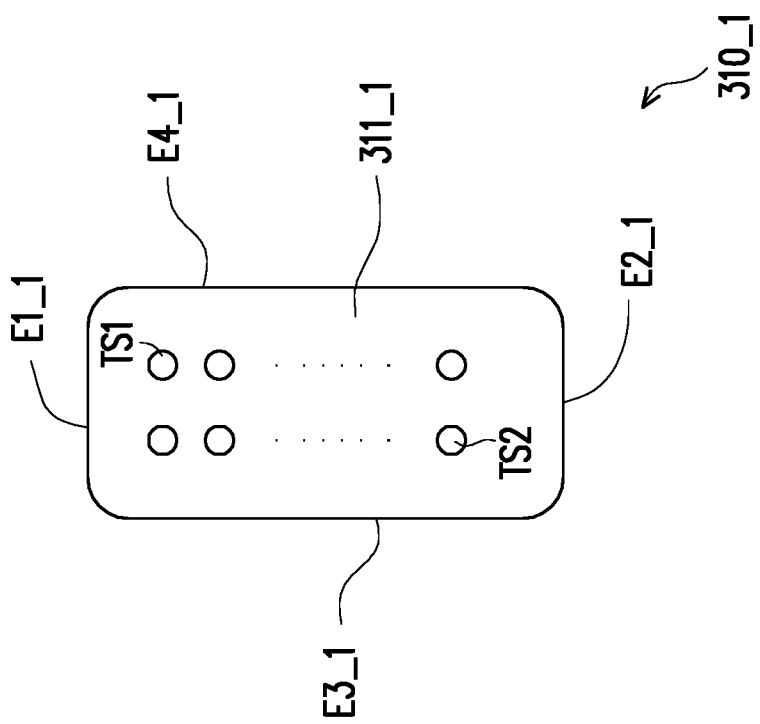
FIG. 3A is a schematic diagram of a connector according to an embodiment of the present disclosure.

Referring to FIG. 3A, FIG. 3A is a schematic diagram of a connector according to an embodiment of the present disclosure. In FIG. 3A, a plurality of pins of the connector 310_1 are arranged in a rectangular array. A corresponding surface 311_1 of the connector 310_1 has short sides E1_1, E2_1 and long sides E3_1, E4_1. The short sides E1_1, E2_1 are not adjacent to each other. The first detecting pin TS1 of the connector 310_1 is one of the pins adjacent to the short side E1_1, and the second detecting pin TS2 of the connector 310_1 is one of the pins adjacent to the short side E2_1. Certainly, in the embodiment, the first pin of the expansion dock adapted to the connector 310_1 is required to have a configuration corresponding to the first detecting pin TS1, and the second pin is required to have a configuration corresponding to the second detecting pin TS2. It should be noted that in the embodiment, since the first detecting pin TS1 and the second detecting pin TS2 of the connector 310_1 are respectively adjacent to the short sides E1_1, E2_1, the connection detecting system may detect whether the connector 310_1 and the expansion dock are connected through a connection status of the pins located adjacent to the short sides E1_1, E2_1 of the connector 310_1, and further eliminate misjudgement caused by incomplete connection between the connector 310_1 and the expansion dock.

For example, the incomplete connection is, for example, a situation that only a small amount of pins adjacent to the short side E1_1 is connected to the expansion dock, and the pins adjacent to the short side E2_1 are not connected to the expansion dock. The connection detection system may determine that the connector 310_1 is not connected to the expansion dock when the connection detection system is unable to detect the high detecting voltage level of the detecting signal SDET due to the pins of the short side E2_1 not connected to the expansion dock.

Referring to FIG. 3B, FIG. 3B is a schematic diagram of a connector according to another embodiment of the present disclosure. Different to the embodiment of FIG. 3A, the short sides E1_2, E2_2 of the corresponding surface 311_2 of the connector 310_2 are curved short sides with non-linear lines, and the plurality of pins of the connector 310_2 are arranged in a non-rectangular array. The first detecting pin TS1 of the connector 310_2 is the pin closest to the short side E1_2, and the second detecting pin TS2 of the connector 310_2 is the pin closest to the short side E2_2. Similar to the embodiment of FIG. 3A, the first detecting pin TS1 and the second detecting pin TS2 of the connector 310_2 are respectively adjacent to the short sides E1_2 and E2_2, and the connection detection system may further eliminate misjudgement caused by incomplete connection between the connector 310_2 and the expansion dock.

Figure 4:
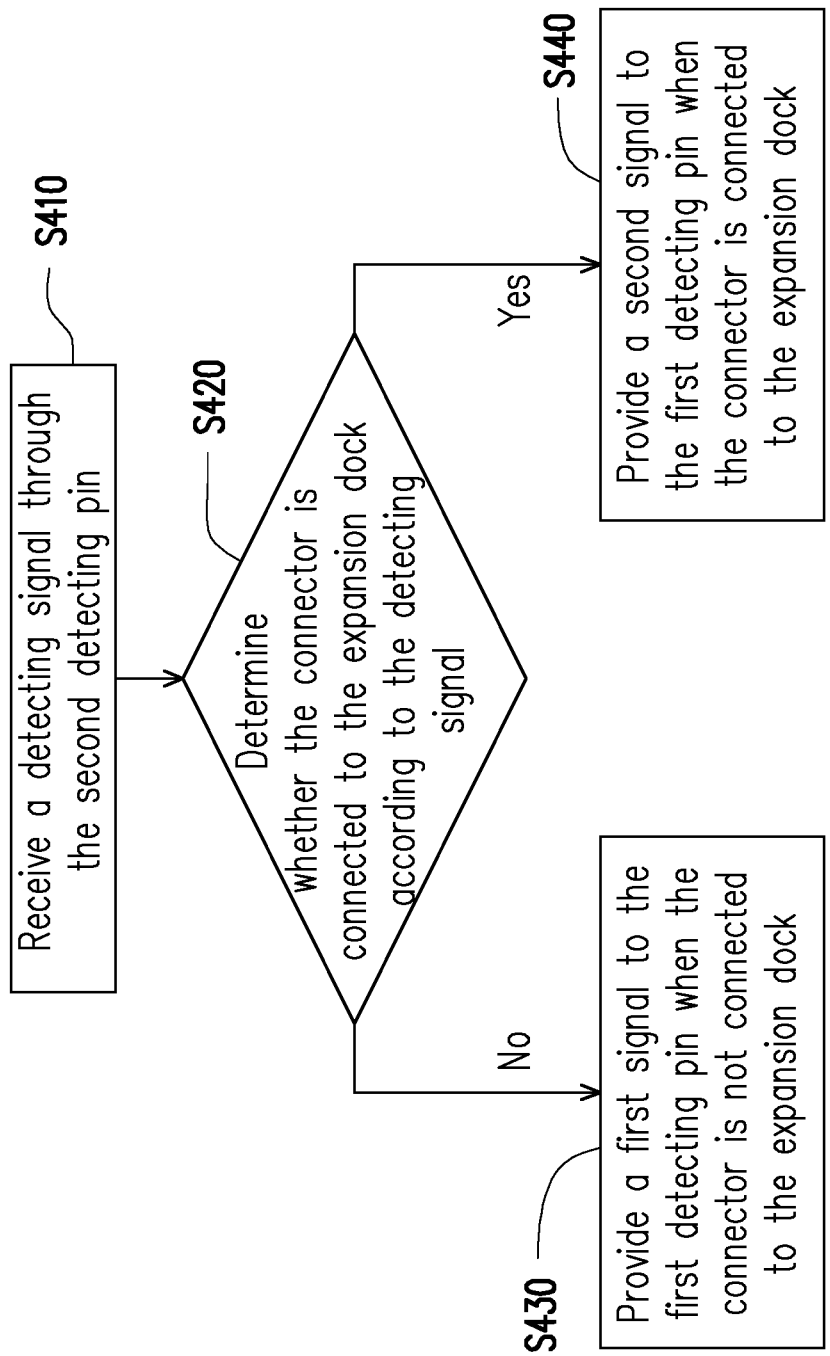
FIG. 4 is a flowchart illustrating a connection detection method according to an embodiment of the present disclosure.

Referring to FIG. 1 and FIG. 4, FIG. 4 is a flowchart illustrating a connection detection method according to an embodiment of the present disclosure. In step S410, the signal transmitter 130 receives the detecting signal SDET through the second detecting pin TS2. In step S420, the signal transmitter 130 determines whether the connector 110 is connected to the expansion dock 120 according to the detecting signal SDET. When the signal transmitter 130 determines that the connector 110 is not connected to the expansion dock 120 according to the detecting signal SDET, a step S430 is executed. In the step S430, the signal transmitter 130 provides the first signal S1 to the first detecting pin TS1. When the signal transmitter 130 determines that the connector 110 is connected to the expansion dock 120 according to the detecting signal SDET in the step S420, a step S440 is executed. In the step S440, the signal transmitter 130 provides the second signal S2 to the first detecting pin TS1. Implementation detail of the connection detection method of FIG. 4 has been introduced in the embodiments of FIG. 1 and FIG. 2, and detail thereof is not repeated.

In summary, the detecting signal is received through the second detecting pin, and whether the connector is connected to the expansion dock is determined according to the detecting signal. The first signal is provided to the first detecting pin when the connector is not connected to the expansion dock, and the second signal is provided to the first detecting pin when the connector is connected to the expansion dock. In the present disclosure, different signals corresponding to different connection statuses are provided to the detecting pin, for example, the PWM signal with the low duty cycle is provided to the detecting pin when the connector is not connected to the expansion dock. In this way, contamination of the pins exposed in the air is effectively mitigated, so as to maintain good contact between the electronic system and the external system. Moreover, in the present disclosure, the pin closest to the first short side is set as the first detecting pin, and the pin closest to the second short side is set as the second detecting pin. In this way, misjudgement caused by incomplete connection between the connector and the expansion dock is eliminated.

It will be apparent to those skilled in the art that various modifications and variations can be made to the structure of the present disclosure without departing from the scope or spirit of the present disclosure. In view of the foregoing, it is intended that the present disclosure cover modifications and variations of this present disclosure provided they fall within the scope of the following claims and their equivalents.

What is claimed is:

1. A connection detection system, comprising:
   an expansion dock;
   a connector, detachably connected to the expansion dock, and having a first detecting pin and a second detecting pin, wherein when the expansion dock is connected to the connector, the second detecting pin receives a first signal or a second signal from the first detecting pin; and
   a signal transmitter, coupled to the connector, and configured to receive a detecting signal through the second detecting pin and determine whether the connector is connected to the expansion dock according to the detecting signal, wherein when the connector is not connected to the expansion dock, the signal transmitter provides the first signal to the first detecting pin, and when the connector is connected to the expansion dock, the signal transmitter provides the second signal to the first detecting pin,
   wherein the first signal is a pulse width modulation signal, and a duty cycle of the first signal is lower than 10%.

2. The connection detection system as claimed in claim 1, wherein the expansion dock has a first pin and a second pin, the first pin and the second pin are coupled to each other, and when the first detecting pin is connected to the first pin and the second detecting pin is connected to the second pin, the signal transmitter provide the second signal to the first detecting pin.

3. The connection detection system as claimed in claim 1, wherein the second signal is a direct current voltage signal of a high voltage level.

4. The connection detection system as claimed in claim 1, wherein when the signal transmitter detects a high detecting voltage level of the detecting signal through the second detecting pin, the signal transmitter provides the second signal to the first detecting pin.

5. The connection detection system as claimed in claim 4, wherein when the signal transmitter does not detect the high detecting voltage level through the second detecting pin, the signal transmitter provides the first signal to the first detecting pin.

6. The connection detection system as claimed in claim 4, further comprising:
   a resistor, having a first end coupled to the second detecting pin and the signal transmitter, and a second end coupled to a reference ground potential.

7. The connection detection system as claimed in claim 1, wherein a corresponding surface of the connector has a first short side and a second short side that is not adjacent to the first short side, the first detecting pin is a pin closest to the first short side, and the second detecting pin is a pin closest to the second short side.

8. A connection detection method, configured to detect connection between a connector and an expansion dock, wherein the connector has a first detecting pin and a second detecting pin, and the connection detection method comprising:
   receiving a detecting signal through the second detecting pin;
   determining whether the connector is connected to the expansion dock according to the detecting signal;
   providing a first signal to the first detecting pin when the connector is not connected to the expansion dock; and
   providing a second signal to the first detecting pin when the connector is connected to the expansion dock,
   wherein the first signal is a pulse width modulation signal, and a duty cycle of the first signal is lower than 10%.

9. The connection detection method as claimed in claim 8, wherein the expansion dock has a first pin and a second pin, the first pin and the second pin are coupled to each other, and when the connector is connected to the expansion dock, the first detecting pin is connected to the first pin and the second detecting pin is connected to the second pin.

* * * * *